United States Patent
Nakagawa et al.

(10) Patent No.: US 9,527,313 B2
(45) Date of Patent: Dec. 27, 2016

(54) LIGHT EMITTING ELEMENTS DRIVE CONTROL DEVICE, DROPLETS-DEPOSITED LAYER DRYING DEVICE AND IMAGE PROCESSING APPARATUS

(71) Applicant: FUJI XEROX CO., LTD., Tokyo (JP)

(72) Inventors: Eigo Nakagawa, Kanagawa (JP); Akira Sakamoto, Kanagawa (JP); Chikaho Ikeda, Kanagawa (JP); Jun Isozaki, Kanagawa (JP)

(73) Assignee: Fuji Xerox Co., Ltd., Tokyo (JP)

( * ) Notice: Subject to any disclaimer, the term of this patent is extended or adjusted under 35 U.S.C. 154(b) by 0 days.

(21) Appl. No.: 14/829,710

(22) Filed: Aug. 19, 2015

(65) Prior Publication Data

US 2016/0214402 A1 Jul. 28, 2016

(30) Foreign Application Priority Data

Jan. 26, 2015 (JP) ................................ 2015-012547

(51) Int. Cl.
| | |
|---|---|
| *B41J 11/00* | (2006.01) |
| *C09D 11/101* | (2014.01) |
| *H05B 37/02* | (2006.01) |
| *H01S 5/062* | (2006.01) |

(52) U.S. Cl.
CPC ............ *B41J 11/002* (2013.01); *C09D 11/101* (2013.01); *H01S 5/062* (2013.01); *H05B 37/0209* (2013.01)

(58) Field of Classification Search
CPC ............... B41J 11/002; B41J 3/28; B41J 2/21; H01S 5/062; H01S 5/0622; H05B 37/0209; C09D 11/40; G03G 15/043
See application file for complete search history.

(56) References Cited

U.S. PATENT DOCUMENTS

| | | | |
|---|---|---|---|
| 7,358,936 B2 * | 4/2008 | Kobayashi | G09G 3/325 |
| | | | 315/169.1 |
| 7,850,280 B2 | 12/2010 | Oyanagi et al. | |
| 7,922,292 B2 | 4/2011 | Miura | |
| (Continued) | | | |

FOREIGN PATENT DOCUMENTS

| | | |
|---|---|---|
| JP | 2002-011860 | 1/2002 |
| JP | 2004-237597 | 8/2004 |
| (Continued) | | |

OTHER PUBLICATIONS

Abstract and machine translation of JP 2007-038634.
(Continued)

*Primary Examiner* — Anh T. N. Vo
(74) *Attorney, Agent, or Firm* — Fildes & Outland, P.C.

(57) ABSTRACT

A light emitting elements drive control device includes: a supplying unit that supplies a common power source voltage to a plurality of light emitting elements whose light emission quantities are controlled individually by current controls; a determining unit that determines voltage ranges capable of assuring proper current control operations on the individual light emitting elements based on drive voltages for the respective light emitting elements that vary as the current controls are performed; and a setting unit that sets the power source voltage to be supplied from the supplying unit from a common voltage range of the voltage ranges determined by the determining unit.

6 Claims, 15 Drawing Sheets

(56) References Cited

U.S. PATENT DOCUMENTS

| | | | | |
|---|---|---|---|---|
| 8,184,670 B2* | 5/2012 | Crawford | ............ | H05B 33/0818 372/30 |
| 8,779,665 B2* | 7/2014 | Oh | .................. | G09G 3/342 315/151 |
| 8,817,060 B2* | 8/2014 | Yamashita | ............ | G03G 15/043 347/236 |
| 2008/0182030 A1 | 7/2008 | Oyanagi et al. | | |
| 2009/0021560 A1 | 1/2009 | Miura | | |
| 2011/0025795 A1 | 2/2011 | Oyanagi et al. | | |
| 2012/0248997 A1* | 10/2012 | Jung | ................ | H05B 33/0815 315/192 |
| 2013/0044272 A1* | 2/2013 | Gao | ................ | H05B 33/0815 349/61 |

FOREIGN PATENT DOCUMENTS

| | | |
|---|---|---|
| JP | 2007-038634 | 2/2007 |
| JP | 4420075 | 12/2009 |

OTHER PUBLICATIONS

Abstract and machine translation of JP 2004-237597.
Abstract and machine translation of JP 2002-011860.
Abstract and machine translation of JP 4420075.

\* cited by examiner

NO COMMON RANGE EXISTS

Ⓤ : MAXIMUM POWER SOURCE VOLTAGE Vp-Nmax
Ⓛ : MINIMUM POWER SOURCE VOLTAGE Vp-Nmin COMMON RANGE EXISTS AND Vp = 48 V FOR UNIT-6 IS SELECTED Ⓤ : MAXIMUM POWER SOURCE VOLTAGE Vp-Nmax
Ⓛ : MINIMUM POWER SOURCE VOLTAGE Vp-Nmin

NO COMMON RANGE EXISTS

Ⓤ : MAXIMUM POWER SOURCE VOLTAGE Vp-Nmax

Ⓛ : MINIMUM POWER SOURCE VOLTAGE Vp-Nmin

COMMON RANGE EXISTS AND Vp = 46 V FOR UNIT-6 IS SELECTED

Ⓤ : MAXIMUM POWER SOURCE VOLTAGE Vp-Nmax

Ⓛ : MINIMUM POWER SOURCE VOLTAGE Vp-Nmin

Unit-11 Unit-12 Unit-13 Unit-14 Unit-15 Unit-16 Unit-17 Unit-18
NO COMMON RANGE EXISTS Ⓤ : MAXIMUM POWER SOURCE VOLTAGE Vp-Nmax
Ⓛ : MINIMUM POWER SOURCE VOLTAGE Vp-Nmin COMMON RANGE EXISTS AND Vp = 46 V FOR UNIT-16 IS SELECTED COMMON RANGE EXISTS AND Vp = 47.5 V FOR UNIT-26 IS SELECTED Ⓤ : MAXIMUM POWER SOURCE VOLTAGE Vp-Nmax
Ⓛ : MINIMUM POWER SOURCE VOLTAGE Vp-Nmin \* THE POWER CONSUMPTION OF THE TRANSISTOR 122 INCREASES FOR RELATIVELY SHORT TIMES ONLY WHEN THE POWER SOURCE VOLTAGE Vp IS INCREASED IN ADVANCE. THEREFORE, THE TEMPERATURE OF THE TRANSISTOR 122 DOES NOT EXCEED THE UPPER LIMIT (THRESHOLD VALUE) OF ITS OPERATION ASSURANCE TEMPERATURE RANGE.

LIGHT EMITTING ELEMENTS DRIVE CONTROL DEVICE, DROPLETS-DEPOSITED LAYER DRYING DEVICE AND IMAGE PROCESSING APPARATUS

CROSS-REFERENCE TO RELATED APPLICATIONS

This application is based on and claims priority under 35 USC 119 from Japanese Patent Application No. 2015-012547 filed on Jan. 26, 2015.

BACKGROUND

1. Technical Field

The present invention relates to a light emitting elements drive control device, a droplets-deposited layer drying device, and an image processing apparatus.

2. Related Art

For example, to dry ink (formed by deposition of ink droplets) in forming an image by an inkjet printer, laser beams emitted from plural laser light emitting element units may be used. The light quantities of laser beams are controlled according to the degrees of drying of ink through constant-current control, for example.

In this case, a common power source voltage is applied from a single power source to plural current control circuits for the constant-current control of the plural laser light emitting element units.

The power source voltage that is applied from the power source is controlled so as to be higher than or equal to a minimum voltage that can stabilize the current control of every laser light emitting element unit.

Each current control circuit performs a current control according to a current value (i.e., a laser drive current necessary for ink drying) specified individually, whereby the associated laser light emitting element unit produces a necessary light emission quantity.

SUMMARY

According to an aspect of the invention, there is provided a light emitting elements drive control device comprising: a supplying unit that supplies a common power source voltage to plural light emitting elements whose light emission quantities are controlled individually by current controls; a determining unit that determines voltage ranges capable of assuring proper current control operations on the individual light emitting elements based on drive voltages for the respective light emitting elements that vary as the current controls are performed; and a setting unit that sets the power source voltage to be supplied from the supplying unit from a common voltage range of the voltage ranges determined by the determining unit.

BRIEF DESCRIPTION OF THE DRAWINGS

Exemplary embodiments of the present invention will be described in detail based on the following figures, wherein:

FIG. 13A shows distributions of minimum power source voltages and maximum power source voltages for respective units before employment of a measure of Example 2, FIG. 13B shows a mode of lighting control on a laser light emitting element before employment of the measure, FIG. 13C is a mode of lighting control on the laser light emitting element after the employment of the measure, FIG. 13D shows distributions of minimum power source voltages and maximum power source voltages for the respective units after the employment of the measure;

FIG. 14A shows distributions of minimum power source voltages and maximum power source voltages for respective units before employment of a measure of Example 3, and FIG. 14B shows distributions of minimum power source voltages and maximum power source voltages for the respective units after the employment of the measure;

FIG. 15A shows distributions of minimum power source voltages and maximum power source voltages for respective units before employment of a measure of Example 4, FIG. 15B shows a light emission mode of laser light emitting elements before the employment of the measure, FIG. 15C shows a light emission mode of the laser light emitting elements after the employment of the measure, FIG. 15D shows sets of distributions of minimum power source voltages and maximum power source voltages for respective units (of two rows arranged in the conveying direction) after the employment of the measure;

FIG. 17A is a timing chart showing a power source voltage Vp corresponding to light emission quantities, and the top part and the bottom part of FIG. 17B show how the power consumption and the temperature of the transistor vary, respectively, according to the light emission quantities.

DESCRIPTION OF SYMBOLS

Figure 1:
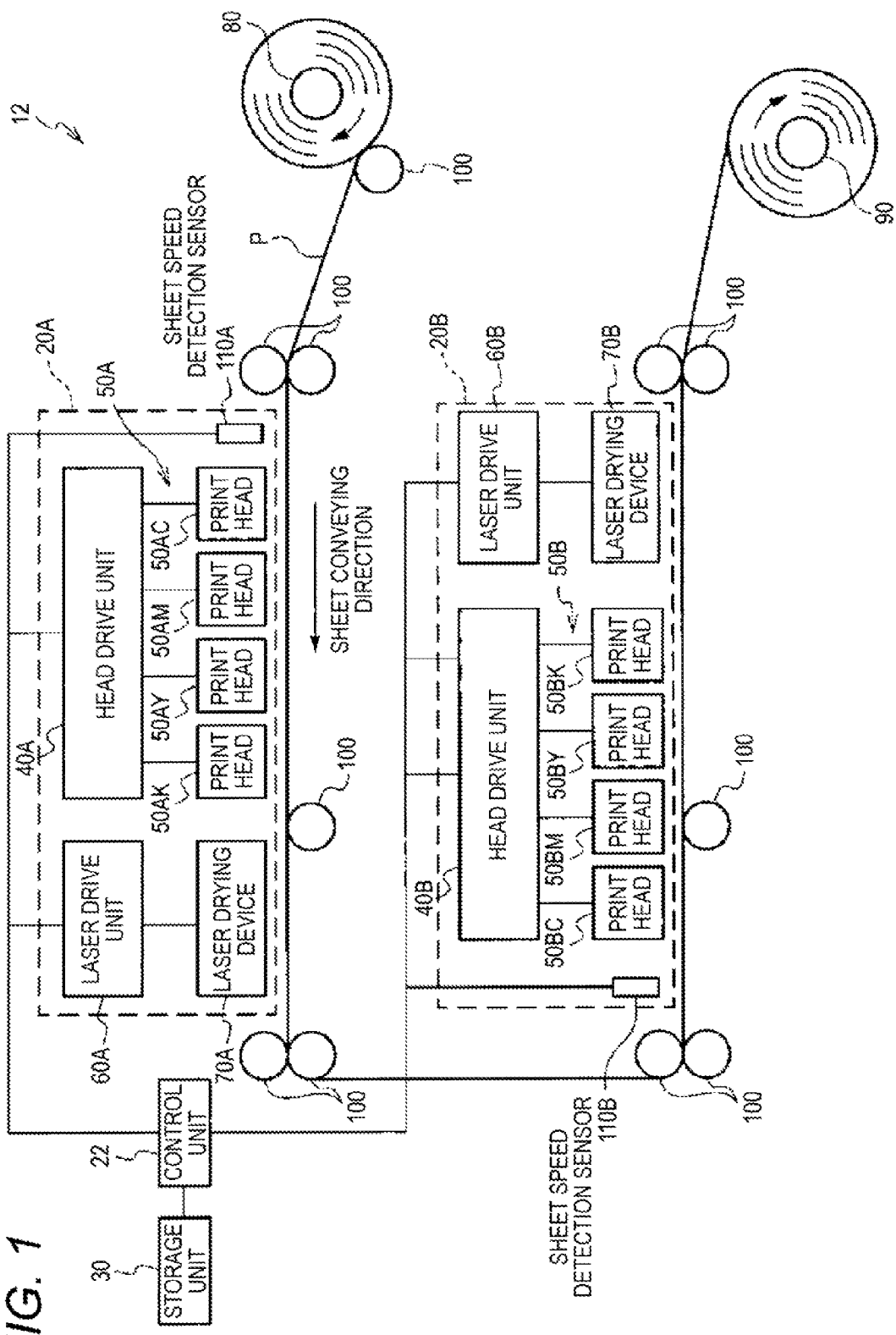
FIG. 1 is a schematic diagram showing a general configuration of a main part of an inkjet recording apparatus according to a first exemplary embodiment.

P: Sheet
12: Inkjet recording apparatus
20: Image forming unit
22: Control unit
30: Storage unit
40: Head drive unit
50: Print head
60: Laser drive unit
70: Laser drying device
72: Laser light emitting element
74: Laser light emitting element group
76: Light emitting portion
80: Sheet feed roll
90: Take-up roll
100: Conveying roller
110A, 110B: Sheet speed detection sensor
102: Light quantity calculating unit
104: Power source control unit
106: Voltage measuring unit
106A, 106B: Voltage measurement terminal
108: Current control unit
110: Current measuring unit
112: Voltage supply unit
114: Constant current source
Vp: Power source voltage
I: Drive current
Vi: instruction voltage
Vak: Drive voltage (Vf+Vd)
Vf: Voltage determined by V-I characteristic of laser light emitting element
Vd: Voltage reflecting difference in drive condition of laser light emitting element
Vds: D-S voltage of transistor
Ids: D-S current of transistor
Vgs: G-S voltage of transistor

DETAILED DESCRIPTION

<Exemplary Embodiment 1>
(Outline of Apparatus)

FIG. 1 is a schematic diagram showing a general configuration of an example main part of an inkjet recording apparatus 12 according to a first exemplary embodiment. For example, the inkjet recording apparatus 12 is equipped with a pair of image forming units 20A and 20B, a control unit 22, a storage unit 30, a sheet feed roll 80, a take-up roll 90, and conveying rollers 100.

The image forming unit 20A includes, for example, a head drive unit 40A, print heads 50A, a laser drive unit 60A, a laser drying device 70A, and a sheet speed detection sensor 110A. Likewise, the image forming unit 20B includes, for example, a head drive unit 40B, print heads 50B, a laser drive unit 60B, a laser drying device 70B, and a sheet speed detection sensor 110B. In the following description, the suffixes "A" and "B" of the symbols denoting the image forming unit 20A and 20B and the pairs of units corresponding to each other included may be omitted when it is not necessary to discriminate between them.

The control unit 22 controls the rotation of the conveying rollers 100 which are connected to a sheet conveying motor (not shown) via a mechanism such as gears by controlling the sheet conveying motor. A sheet P (recording medium) which is long in the sheet conveying direction is wound on the sheet feed roll 80, and the sheet P is conveyed in the sheet conveying direction as the conveying rollers 100 are rotated.

The control unit 22 acquires image information that is stored in, for example, the storage unit 30 and forms an image corresponding to the acquired image information on one surface of the sheet P by controlling the image forming unit 20A on the basis of pixel-by-pixel color information contained in the image information.

More specifically, the control unit 22 controls the head drive unit 40A. The head drive unit 40A forms an image corresponding to image information on one surface of the sheet P being conveyed by causing the print heads 50A (connected to the head drive unit 40A) to eject ink droplets by driving it according to ink droplets ejection timing specified by the control unit 22.

Color information of each pixel contained in pixel information includes information indicating a color of the pixel uniquely. Although the first exemplary embodiment assumes an example case that color information of each pixel of an image is represented by densities of yellow (Y), magenta (M), cyan (C), and black (K), another representation method for representing colors of an image uniquely may be employed.

The print heads 50A are four print heads 50AY, 50AM, 50AC, and 50AK corresponding to the four respective colors Y, M, C, and K, and eject ink droplets which are droplets of the respective colors. The drive method for causing the print heads 50A to eject ink droplets is not restricted to any particular method and may be any of known methods such as the thermal method and the piezoelectric method.

The laser drive unit 60A is equipped with current controlling and switching elements such as FETs (field-effect transistors) for controlling the laser light emitting elements 72 (see FIG. 2) provided in the laser drying device 70A, and drives the switching elements on the basis of instructions form the control unit 22. In the first exemplary embodiment, the laser light emitting elements 72 may be semiconductor lasers.

The control unit 22 causes the laser drying device 70A to emit laser light toward one image forming surface of the sheet P by controlling the laser drive unit 60A, and fixes an image formed on the sheet P by drying the ink of the image by generated heat (input heat) which depends on the quantity of laser light. The control unit 22 can increase the drying efficiency by performing laser irradiation controls (duty ratio controls) on the basis of image information while maintaining drive currents I.

Alternatively, the magnitudes of drive currents I may be controlled. The distance between the laser drying device 70A and the sheet P is set according to the radiation angle of each laser light emitting element 72 and the size of an irradiation region.

The sheet P is then conveyed to the position where it is opposed to the image forming unit 20B as the conveying roller 100 are rotated. The sheet P is conveyed so that the image forming surface that is opposite to the one on which the image has been formed by the image forming unit 20A will be opposed to the image forming unit 20B.

The control unit 22 forms an image corresponding to image information on the other image forming surface of the sheet P by controlling the image forming unit 20B in the same manner as it controlled the image forming unit 20A. As such, the inkjet recording apparatus 12 is equipped with the two image forming units 20A and 20B so as to be capable of printing on both surfaces of a sheet P.

The sheet P is conveyed to the take-up roll 90 as the conveying roller 100 are rotated, and is taken up by the take-up roll 90.

Each of the sheet speed detection sensors 110A and 110B is disposed, for example, at such a position as to be opposed to the image forming surface of the sheet P, detects a conveyance speed of the sheet P in the sheet conveying direction, and communicates it to the control unit 22.

Using the conveyance speed of the sheet P acquired from each of the sheet speed detection sensors 110A and 110B, the control unit 22 controls the drive timing of the corresponding laser drive unit 60 so that the corresponding laser drying device 70 irradiates the sheet P with laser light with such timing that the ink that has been deposited on the sheet P reaches the laser light irradiation region.

The method by which each of the sheet speed detection sensors 110A and 110B detects a conveyance speed of the sheet is not restricted to any particular method and may be any of known methods. It is noted that the sheet speed detection sensors 110A and 110B are not indispensable in the inkjet recording apparatus 12 according to the first exemplary embodiment.

There are various kinds of inks such as water-based inks, oil-based inks whose solvents evaporate, ultraviolet-setting inks. The first exemplary embodiment assumes use of water-based inks. In the first exemplary embodiment, it is assumed that the terms "ink" and "ink droplets" mean water-based ink and water-based ink droplets unless otherwise specified.

(Laser Drying Device)

Figure 2:
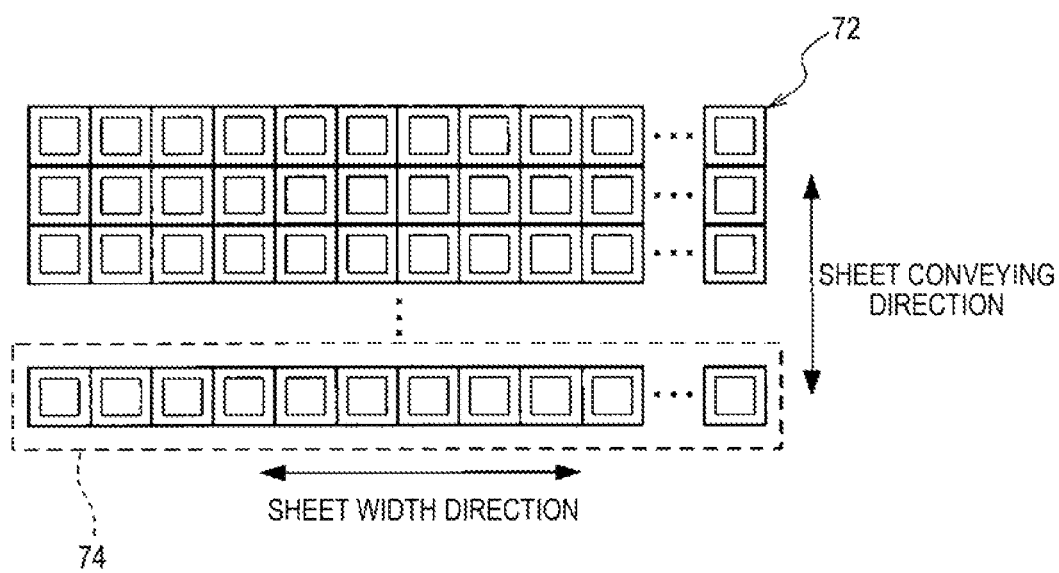
FIG. 2 shows an example laser light emission surface of each laser drying device according to the first exemplary embodiment.
Figure 2:
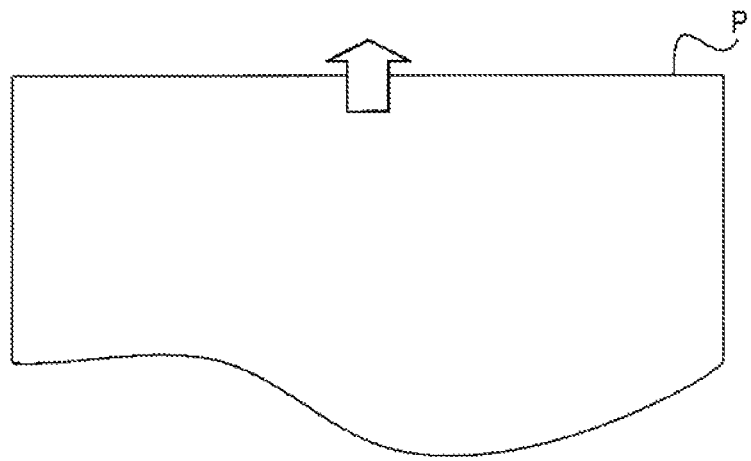

FIG. 2 shows an example laser light emission surface of each laser drying device 70. The laser light emission surface of each laser drying device 70 is a surface that is opposed to the image forming surface of the sheet P. As shown in FIG. 2, plural laser light emitting elements 72 are arranged on the laser light emission surface in lattice form in the sheet conveying direction and the sheet width direction which is perpendicular to the sheet conveying direction.

In the first exemplary embodiment, a VCSEL (vertical cavity surface emitting laser) which is of a surface emission type is employed as each laser light emitting element 72. The number and the manner of arrangement of the laser light emitting elements 72 that are arranged on the laser light emission surface of the laser drying device 70 as shown in FIG. 2 are just examples.

In the first exemplary embodiment, each row of laser light emitting elements 72 arranged in the sheet width direction which is a unit of light quantity control (constant-current control) by the corresponding laser drive unit 60 (see FIG. 1) is referred to as a laser light emitting element group 74.

In the arrangement shown in FIG. 2, plural laser light emitting element groups 74 each extending in the sheet width direction are arrange in the sheet conveying direction. Whereas in FIG. 2 each laser light emitting element group 74 covers the entire region in the sheet width direction, a series connection of plural laser light emitting element groups 74 (e.g., each consisting of eight laser light emitting elements 72) may cover the entire region in the sheet width direction. Each laser light emitting element group 74 is a unit of application of a common power source voltage from a power supply unit 112 (see FIG. 5).

Figure 3:
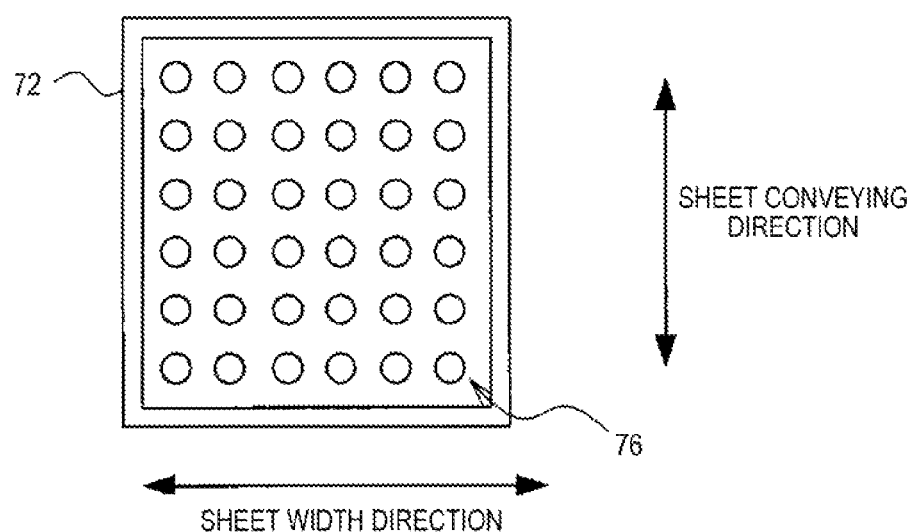
FIG. 3 shows an example laser light emission surface of each laser light emitting element employed in the first exemplary embodiment.

FIG. 3 shows an example laser light emission surface of each laser light emitting element (VCSEL) 72. Like the laser light emission surface of the laser drying device 70, the laser light emission surface of each laser light emitting element 72 is a surface that is opposed to the image forming surface of the sheet P.

Plural light emitting portions (dies) 76 are arranged on the laser light emission surface of each laser light emitting element 72 in lattice form in the sheet conveying direction and the sheet width direction, and each light emitting portion 76 emits laser light with timing that is determined by an on/off control of the laser light emitting element 72. The number and the manner of arrangement of the light emitting portions 76 that are arranged in each laser light emitting element 72 as shown in FIG. 3 are just examples.

Figure 4:
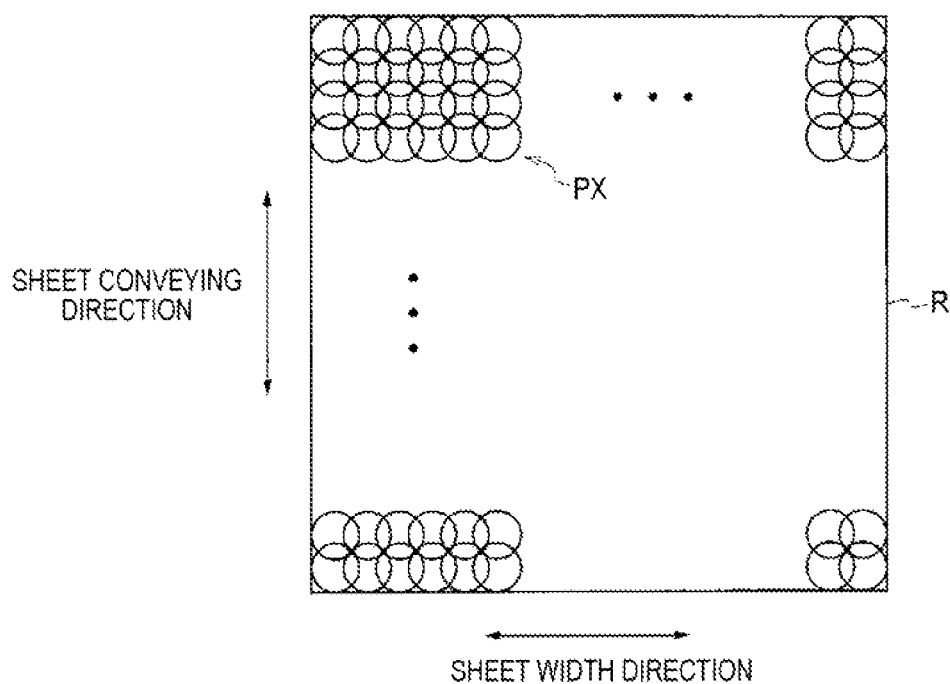
FIG. 4 shows an example laser light irradiation range of one laser light emitting element.

Next, a description will be made of a relationship between ink deposited on the sheet P and the laser light irradiation range of each laser light emitting element 72. FIG. 4 shows a laser light irradiation range R of one laser light emitting element 72.

As shown in FIG. 4, in the laser drying device 70 according to the first exemplary embodiment, the laser light irradiation range R of each laser light emitting element 72 is set so as to include plural ink droplets PX. For example, where the printing resolution of the print head 50 is 1,200 dpi (dots per inch), the laser light irradiation range R is set so as to include 60 ink droplets PX in each of the sheet conveying direction and the sheet width direction. In this case, the laser light irradiation range R is a square that measures 1.27 mm in each of the sheet conveying direction and the sheet width direction. In this manner, each laser light emitting element 72 dries an ink layer formed by deposition of plural ink droplets PX.

(Drying Control)

Figure 5:
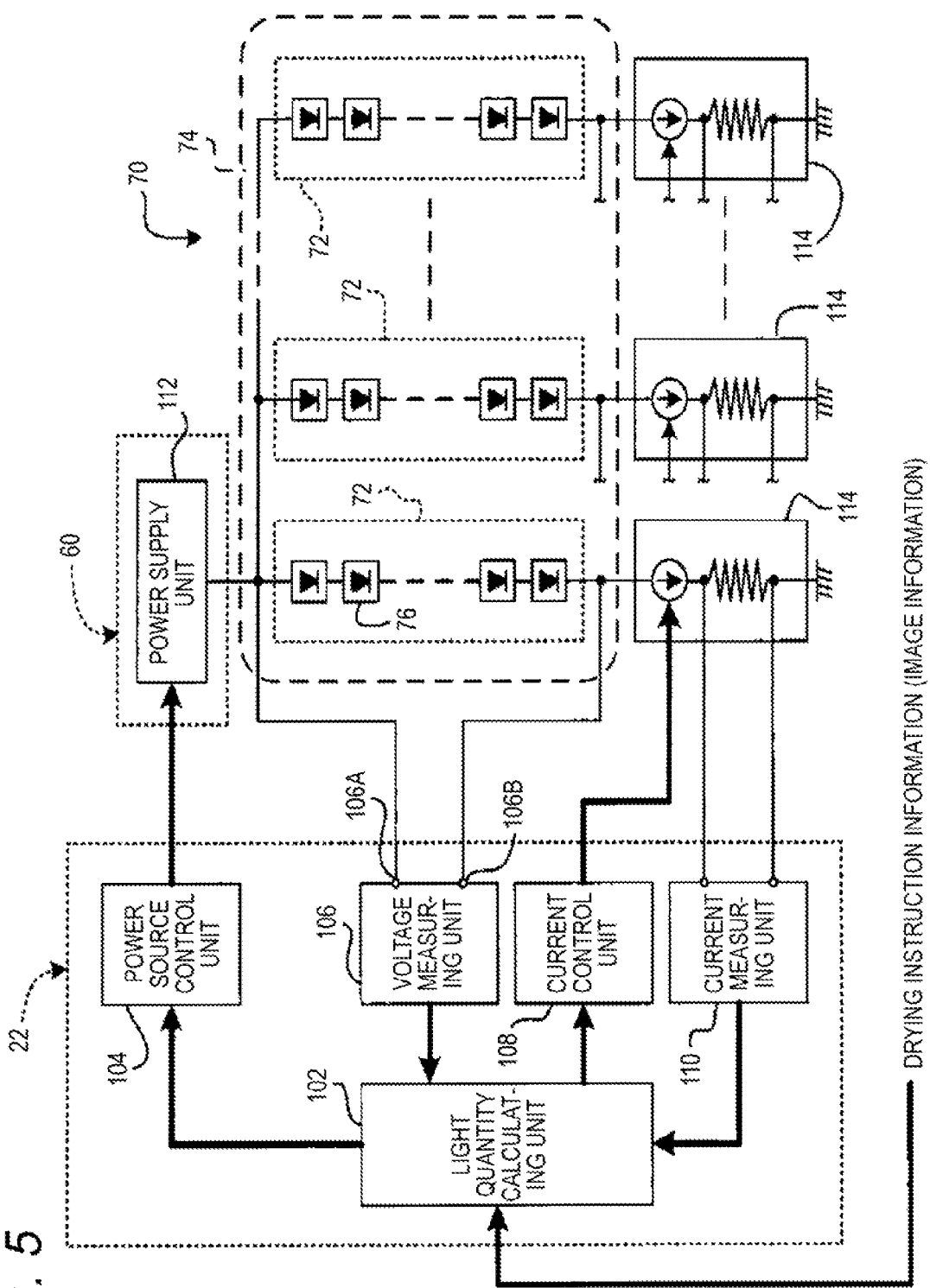
FIG. 5 is a block diagram illustrating a drying control function that is performed by a control unit on each set of a laser drive unit and a laser drying device.

FIG. 5 is a block diagram illustrating a drying control function that is performed by the control unit 22 by each set of a laser drive unit 60 and a laser drying device 70. FIG. 5 shows functional blocks of a particular function (drying control function) of the control unit 22 and should not be construed as restricting its hardware configuration.

As shown in FIG. 5, the control unit 22 is equipped with a light quantity calculating unit 102 which functions as an example of a determining unit, a setting unit, and a predicting unit and a power source control unit 104, a voltage measuring unit 106, a current control unit 108, and a current measuring unit 110 which function as an example of a changing unit.

The power source control unit 104 controls power supply units 112 (which function as an example of supplying units) of the laser drive unit 60 so that they supply power (applies predetermined voltages) to the laser light emitting elements 72 with timing that is suitable for their emission timing. The power supply units 112 are provided for the respective laser light emitting element groups 74. In other words, each power supply unit 112 is connected to the anode sides of plural laser light emitting elements 72 to supply common power (i.e., apply a common voltage) to them.

The cathode sides of the laser light emitting elements 72 are grounded via respective constant current sources 114 which operate independently of each other. In the following description, each independent combination of a laser light emitting element 72 and a constant current source 114 may be referred to as a "unit."

The anode side and the cathode side of each laser light emitting element 72 are connected to a pair of voltage measurement terminals 106A and 106B. The voltage measuring unit 106 measures an anode-cathode voltage (may be referred to as an A-K voltage below) of each laser light emitting element 72. The A-K voltage corresponds to a drive voltage Vak (described later).

The current control unit 108 and the current measuring unit 110 of the control unit 22 are connected to each constant current source 114. The current measuring unit 110 measures a current that flows through each laser light emitting element 72. The current control unit 108 instructs each constant current source 114 on a drive current I (to flow through the laser light emitting element 72) as a reference of a constant-current control. Each constant current source 114 performs a constant-current by controlling the A-K voltage (drive voltage Vak) to produce the specified drive current I.

The laser drying device 70 irradiates the paper P being conveyed (see FIG. 2) with laser light and thereby dries ink using heat generated by the laser light (input heat). In doing so, for example, the light quantity calculating unit 102 calculates proper light emission quantities (P) of the laser light emitting elements 72 on the basis of ink droplets ejection amounts corresponding to image information that was used for image formation and the constant current sources 114, the current control unit 108, and the current measuring unit 110 perform current controls.

As a result, theoretically, a drying operation is performed with generated heat amounts that are suitable for ink droplets ejection amounts. To suppress the power consumption, it is preferable that the power (power source voltage Vp) that is supplied from each power supply unit 112 be set at a minimum value that is necessary for stable driving of the laser light emitting elements 72.

(Constant-current Control of Laser Light Emitting Element)

Figure 6:
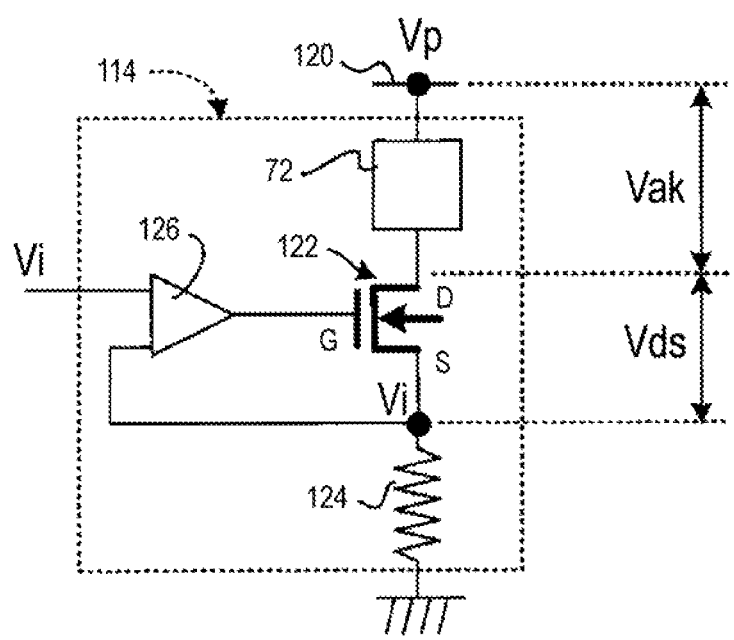
FIG. 6 is a circuit diagram of a circuit capable of operating as each constant current source employed in the first exemplary embodiment.

FIG. 6 is an example circuit diagram of a circuit capable of realizing the set of functions shown in FIG. 5 that are performed by each power supply unit 112, the current control unit 108, and the constant current sources 114.

As shown in FIG. 6, a power line 120 bearing a power source voltage Vp that is applied from the power supply unit 112 is connected to the anode side of a laser light emitting element 72. The drain (D) of a transistor 122 that belongs to the constant current source 114 is connected to the cathode side of the laser light emitting element 72.

The source (S) of the transistor 122 is grounded via a resistor 124 and its gate (G) is connected to an OP amplifier (differential amplifier) 126. In the following description, the drain, source, and gate of the transistor 122 may be represented merely by the respective symbols "D," "S," and "G."

One input end of the OP (Operational) amplifier 126 is connected to the connecting point of the source (S) of the transistor 122 and the resistor 124. As a result, an instruction voltage Vi that is based on a drive current I (described later) is input to the one input end of the OP amplifier 126. The instruction voltage Vi for the laser light emitting element 72 that is based on the drive current I is input to the other input end of the OP amplifier 126.

In the constant current source 114, the A-K voltage (hereinafter referred to as a drive voltage Vak) is controlled by the D-S channel of the transistor 122 according to the instruction voltage Vi that is based on the drive current I.

In designing the circuit shown in FIG. 6, it is necessary to recognize a range of the D-S voltage Vds of a region where the D-S current Ids is constant (flat) in a Vds-Ids characteristic (i.e., a relationship between the D-S voltage and the D-S current) of the transistor 122.

Figure 7:
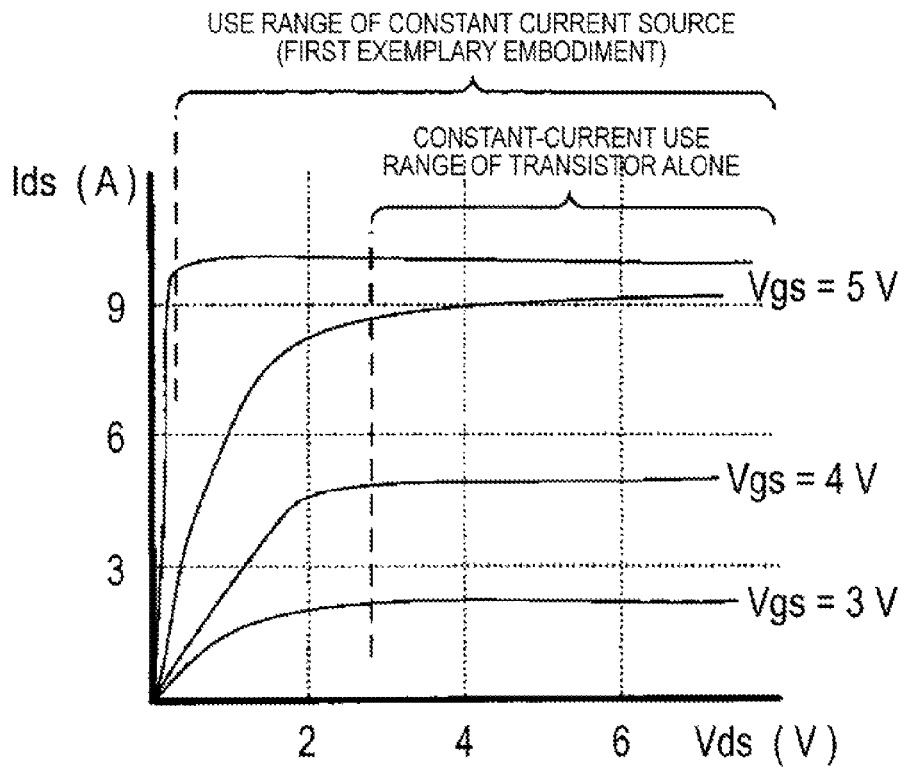
FIG. 7 shows a voltage-current characteristic of a transistor employed in each constant current source.

FIG. 7 shows a Vds-Ids characteristic of the transistor 122 employed in the first exemplary embodiment. It is seen from FIG. 7 that when the D-S voltage Vds is approximately in a range of 2.5 V to 3.0 V, the D-S current Ids is constant for each of G-S voltages Vgs 3 V, 4 V, and 5 V.

In the first exemplary embodiment, it is understood that since a voltage corresponding to the difference between the instruction voltage Vi that is based on the drive current I and the source voltage of the transistor 122 in the constant current source 114 (theoretically, equal to the instruction voltage Vi that is based on the drive current I), the D-S current Ids starts to become constant at a D-S voltage Vds above 1.0 V. That is, in the first exemplary embodiment, the minimum voltage Vds_min of the range of the D-S voltage Vds to be used by the constant current source 114 is equal to 1 V.

Figure 8:
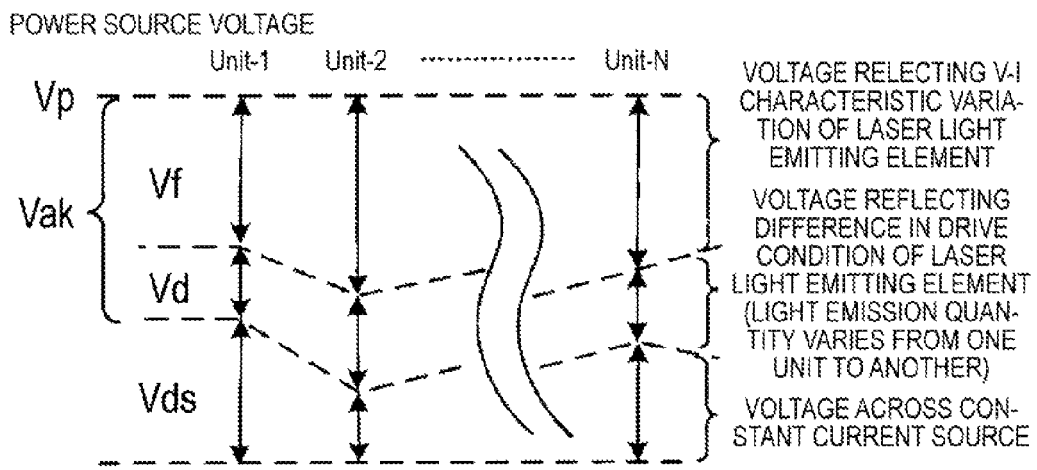
FIG. 8 compares relationships between the voltage across the laser light emitting element and the voltage across the constant current source (the power source voltage is constant)

Incidentally, as shown in FIG. 8, the drive voltages of the plural laser light emitting elements 72 which are driven by the respective circuits described above are different from each other. That is, the drive voltage Vak for each unit includes the forward voltage Vf of the laser light emitting element 72 which varies with its V-I characteristic and the voltage Vd that varies depending on the drive condition or on the individual characteristic variation of the laser light emitting element 72. Therefore, the drive voltage Vak which is the sum of the voltages Vf and Vd (Vak=Vf+Vd) varies from one unit to another.

Since the common power source voltage Vp is applied from the power supply unit 112 to each combination of a laser light emitting element 72 and a constant current source 114, the variation in the drive voltages Vak influences the D-S voltage Vds of the transistor 122, that is, influences the constant current source 114. An example influence will be described below.

(Example Influence on Constant Current Source 114)

FIG. 8 shows relationships between the drive voltage Vak (=Vf+Vd) and the D-S voltage Vds of the transistor 122 (the power source voltage Vp is constant) for N laser light emitting elements 72 arranged in the sheet P width direction (unit-1, unit-2, . . . , unit-N).

In each laser light emitting element group 74 (consisting of plural laser light emitting elements 72 arranged in the sheet P width direction) which is supplied with power from a conmon power supply unit 112, there are a region with small ink droplets ejection amounts and a region with large ink droplets ejection amounts.

As a result, as shown in FIG. 8, unit-1, unit-2, . . . , unit-N are different from each other in the drive voltage Vak of the laser light emitting element 72. That is, in unit-1, unit-2, . . . , unit-N, for the common power source voltage Vp, there is a correlation between the differences between the drive voltages Vak and the differences between the D-S voltages Vds of the transistors 122 (Vp=Vak+Vds).

Figure 9:
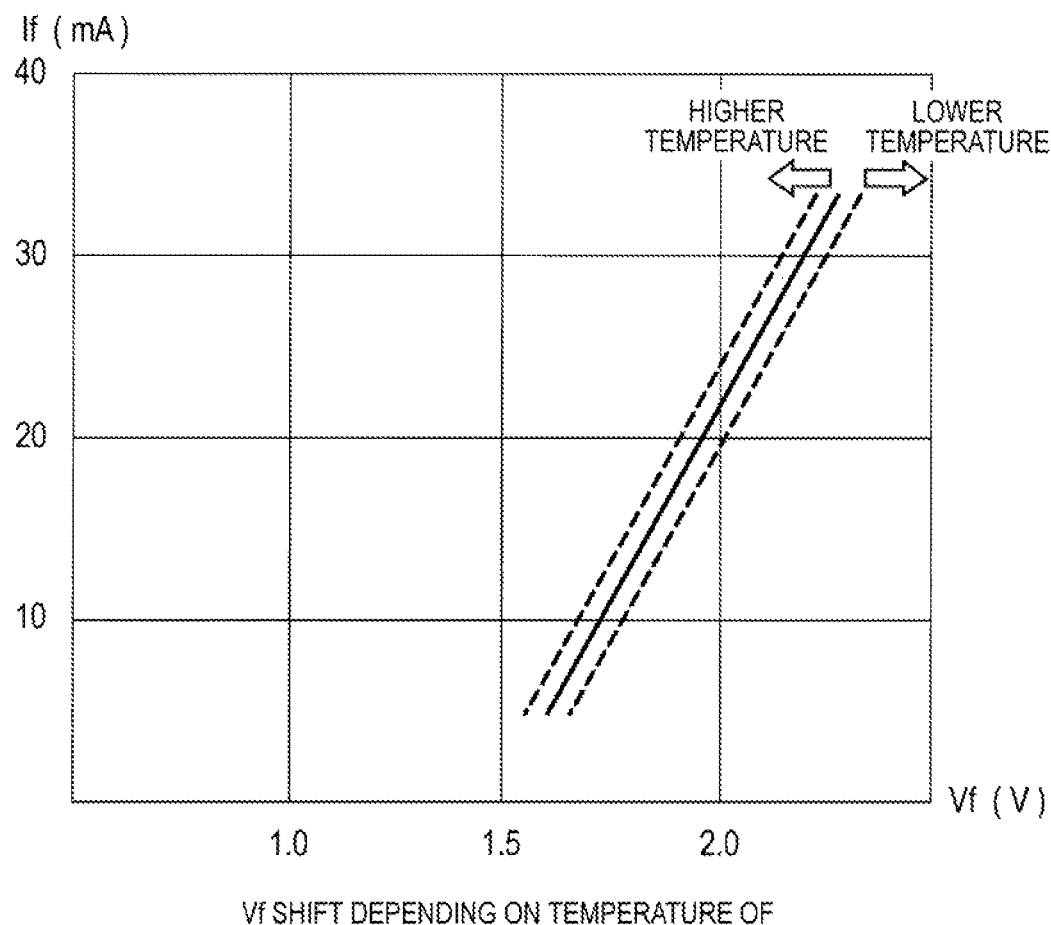
FIG. 9 is a graph showing a voltage-current characteristic of a laser light emitting element.

As shown in FIG. 9, one factor in the variation of the drive voltage Vak of the laser light emitting element 72 is a variation in the V-I characteristic of the laser light emitting element 72. FIG. 9 shows an example V-I characteristic of a laser light emitting element 72 that can be used in the first exemplary embodiment.

As shown in FIG. 9, the variation (ΔVf) of the voltage Vf (part of the drive voltage Vak) due to a variation of the V-I characteristics of the laser light emitting elements 72 of the respective units is caused by thermal drifts and differences between the individual laser light emitting elements 72. That is, if the V-I characteristic is shifted from an original characteristic indicated by a solid line in FIG. 9 to either of characteristics indicated by broken lines, the forward voltage and current vary to affect the driving of the laser light emitting element 72.

In a range where a drive current I is small, since the drive voltage Vak of the laser light emitting element 72 is low, the D-S voltage Vds of the transistor 122 of the associated constant current source 114 increases accordingly, which may obstruct the operation of the constant current source 114 through heat generation.

In the first exemplary embodiment, the following measure is taken to solve this problem. When an instruction voltage Vi (that is based on a drive current I) for obtaining a necessary light emission quantity that corresponds to ink droplets ejection amounts is determined, a lower limit value and an upper limit value of the drive voltage Vak of each of the laser light emitting elements 72 belonging to the laser light emitting element group 74 that is supplied with power from a common power supply unit 112 are determined and then a power source voltage Vp range as a common allowable range for all of the laser light emitting elements 72 is set (determination of a power source voltage Vp range). In the first exemplary embodiment, the lowest voltage of the power source voltage Vp range as the common allowable range is set as a power source voltage Vp (as an energy saving measure).

(Workings of the First Exemplary Embodiment)

Figure 10:
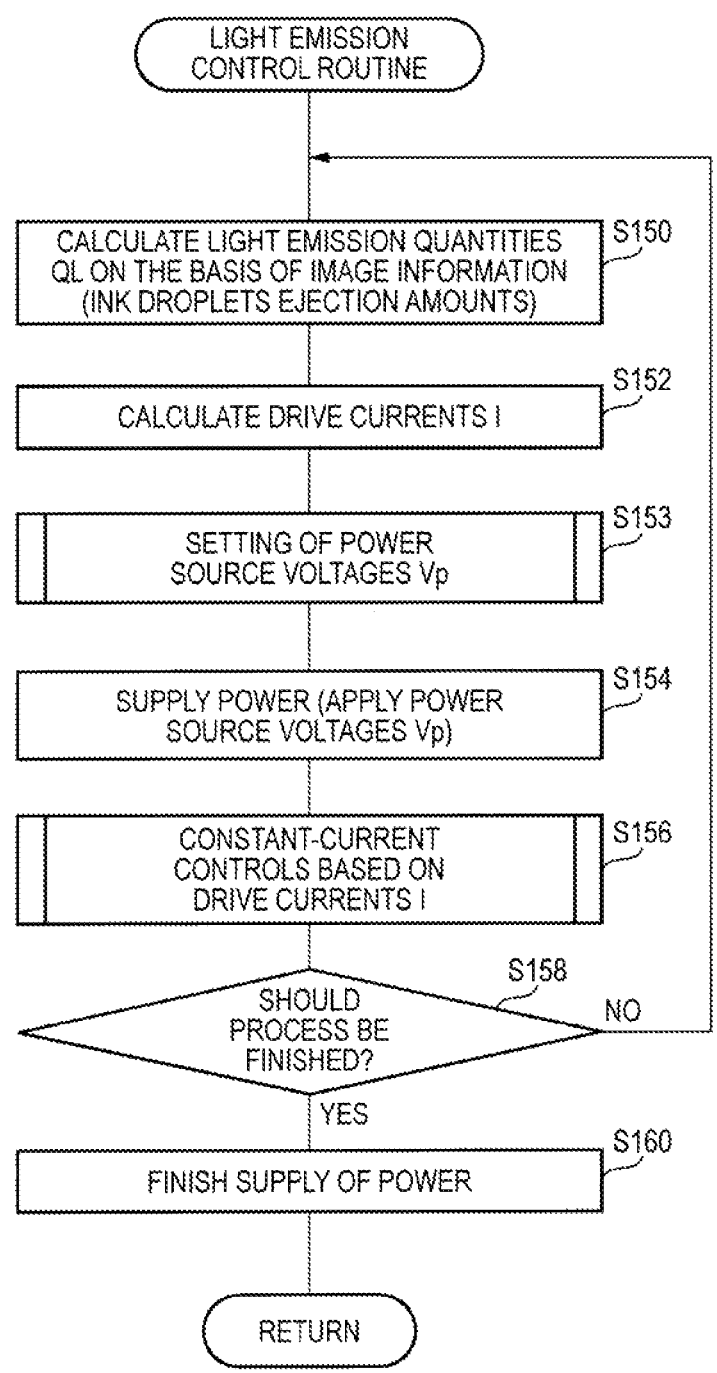
FIG. 10 is a flowchart of a light emission control routine employed in the first exemplary embodiment.

FIG. 10 is a flowchart of a light emission control routine that is executed by the light quantity calculating unit 102 of the control unit 22 in the first exemplary embodiment.

Upon arrival of a time for drying by the laser drying device 70, first, at step S150, light emission quantities QL are calculated on the basis of image information (ink droplets ejection amounts). Then the process moves to step S152, where drive currents I are calculated in synchronism with conveyance of the sheet P.

At step S153, a power source voltage Vp setting process is executed. At step S153, a common, optimum power source voltage Vp is set for each laser light emitting element group 74 according to ink droplets ejection amounts (image densities) that are different from each other in the sheet P width direction. Step S153 will be described later in detail using a flowchart of FIG. 11.

At step S154, the power supply units 112 of the laser drive unit 60 are driven being controlled by the power source control unit 104, whereby power is supplied (i.e., power source voltages Vp that have been set at step S152 are supplied) to the laser light emitting elements 72. As a result, the laser light emitting elements 72 emit light and the sheet P being conveyed is irradiated and ink is dried.

At step S156, constant-current controls are performed by the constant current sources 114. In the constant-current control of each constant current source 114, the current control unit 108 determine an instruction voltage Vi on the basis of a drive current I specified by the light quantity calculating unit 102 and outputs a voltage to the gate (G) of the transistor 122 via the OP amplifier 126, whereby a D-S voltage Vds of the transistor 122 is determined according to the instruction voltage Vi that has been determined on the basis of the drive current I and the drive voltage Vak of the laser light emitting element 72 is controlled.

The currents flowing through the respective laser light emitting element 72 are kept constant by the constant-current controls, whereby a stable drying operation with no incomplete or excessive drying is performed.

At step S158, it is judged whether to complete the process, that is, whether or not the region to be subjected to drying of the sheet P has passed the laser drying device 70. If the judgment result is negative (i.e., a region to be subjected to drying remains in the sheet P), the process returns to step S150 to execute the above steps again.

If the judgment result of step S158 is affirmative ("YES") (i.e., the region to be subjected to drying of the sheet P has passed the laser drying device 70), the process returns to step S160, where the supply of power from the power supply units 112 is finished. Thus, the execution of this routine is finished.

In the first exemplary embodiment, when the light emission control process of FIG. 10 is executed, a voltage (power source voltage Vp) to be applied from each power supply unit 112 to the anode side of the laser light emitting elements 72 belonging to the corresponding laser light emitting element group 74 is set.

In each laser light emitting element group 74 (consisting of plural laser light emitting elements 72) which is supplied with power from a common power supply unit 112, for the laser light emitting elements 72 in a region with small ink droplets ejection amounts, the drive current I becomes small and the instruction voltage Vi that is based on the drive current I goes low. On the other hand, for the laser light emitting elements 72 in a region with large ink droplets ejection amounts, the drive current I becomes large and the instruction voltage Vi becomes high. As a result, differences occur between the drive voltages Vak for the respective laser light emitting elements 72.

On the other hand, since the power source voltage Vp is common to unit-1, unit-2, . . . , unit-N, the differences between the drive voltages Vak result in differences between the D-S voltages Vds of the respective transistors 122. In particular, in a range that the drive current I is small, the drive voltage Vak of the laser light emitting element 72 is low and hence the D-S voltage Vds of the transistor 122 becomes high. The transistor 122 heats up accordingly to decrease the amount of heat that can be used effectively for drying.

In view of the above, in the first exemplary embodiment, a common power source voltage Vp is set according to ink droplets ejection amounts to suppress influences on the D-S voltages Vds of the respective transistors 122.

Figure 11:
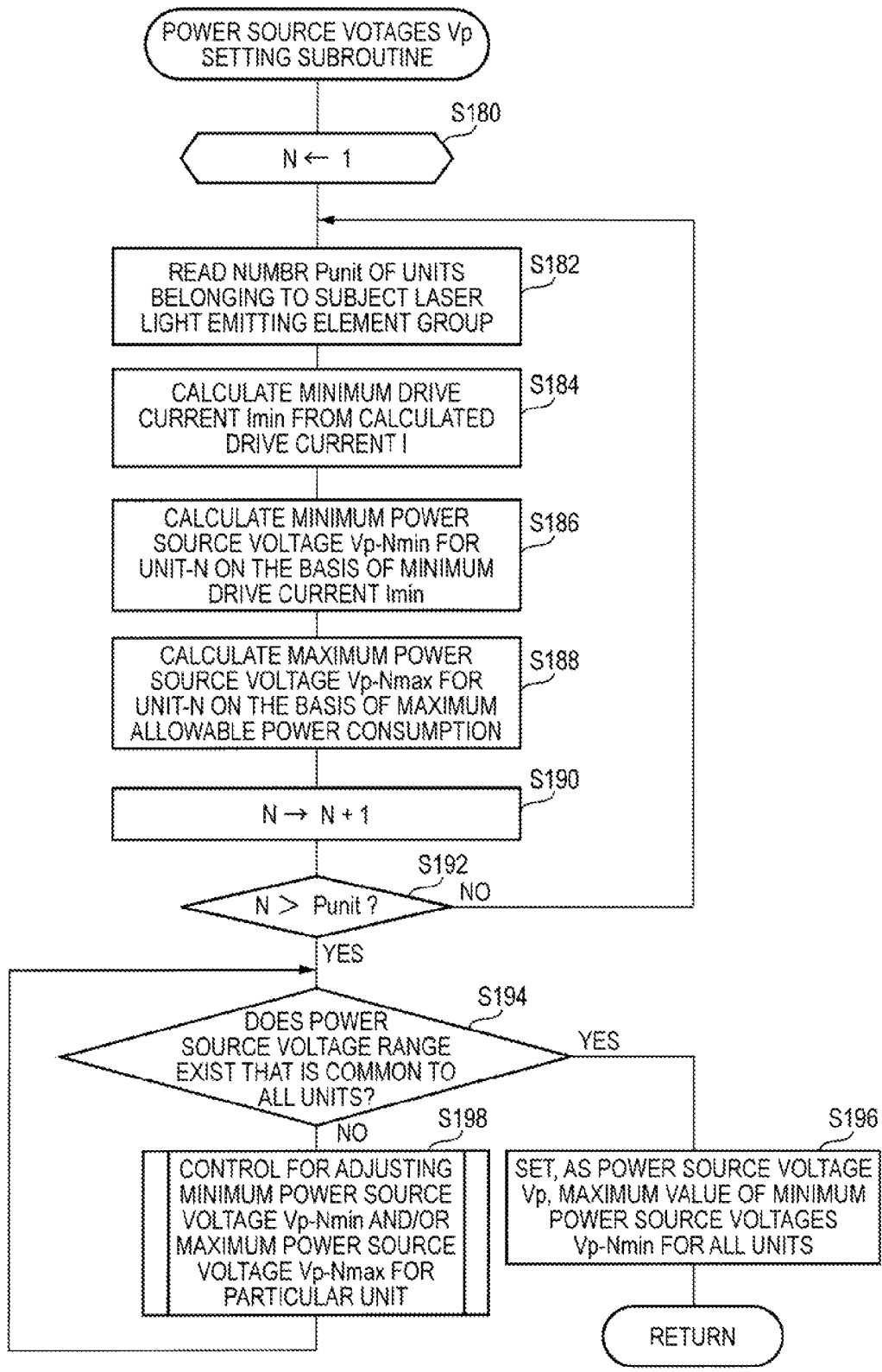
FIG. 11 is a flowchart of a power source voltage control subroutine which is executed at step S153 shown in FIG. 10.

FIG. 11 is a flowchart of a power source voltage Vp setting control subroutine which is executed at step S153 shown in FIG. 10.

At step S180, variable N for counting of the number of units of a laser light emitting element group 74 is set at an initial value (N=1). At step S182, the number Punit of laser light emitting elements 72 (i.e., the number of units) to which a common power source voltage Vp is to be set and applied and that belong to a subject laser light emitting element group 74 is read out.

At step S184, a minimum drive current Imin for unit-N is calculated from the drive currents I that have been calculated at step S152 shown in FIG. 10. At step S186, a minimum power source voltage Vp-Nmin for unit-N is calculated on the basis of the minimum drive current Imin.

At step S188, a maximum power source voltage Vp-Nmax for unit-N is calculated on the basis of a maximum allowable power consumption.

At step S190, variable N is incremented (N←N+1). At step S192, it is judged whether variable N is larger than the number Punit of units (N>Punit).

If the judgment result of step S192 is negative ("NO"), which means that a unit(s) remains for which to calculate a minimum power source voltage Vp-Nmin and a maximum power source voltage Vp-Nmax, the process returns to step S182 to execute the above steps again.

If the judgment result of step S192 is affirmative, which means that a minimum power source voltage Vp-Nmin and a maximum power source voltage Vp-Nmax have been calculated for every unit, the process moves to step S194.

At step S194, it is judges whether or not a power source voltage range that is common to the ranges (which are delimited by the minimum power source voltage Vp-Nmin and the maximum power source voltage Vp-Nmax, respectively) for all of the units exist.

If the judgment result of step S194 is affirmative, the process moves to step S196, where a maximum value of the minimum power source voltages Vp-Nmin for all of the units is set as a power source voltage Vp. Then, the execution of this routine is finished.

If the judgment result of step S194 is negative, the process moves to step S198, where a control for adjusting the minimum power source voltages Vp-Nmin and/or maximum power source voltages Vp-Nmax for a particular unit is performed. And the process returns to the judgment step S194.

EXAMPLE 1

Figure 12:
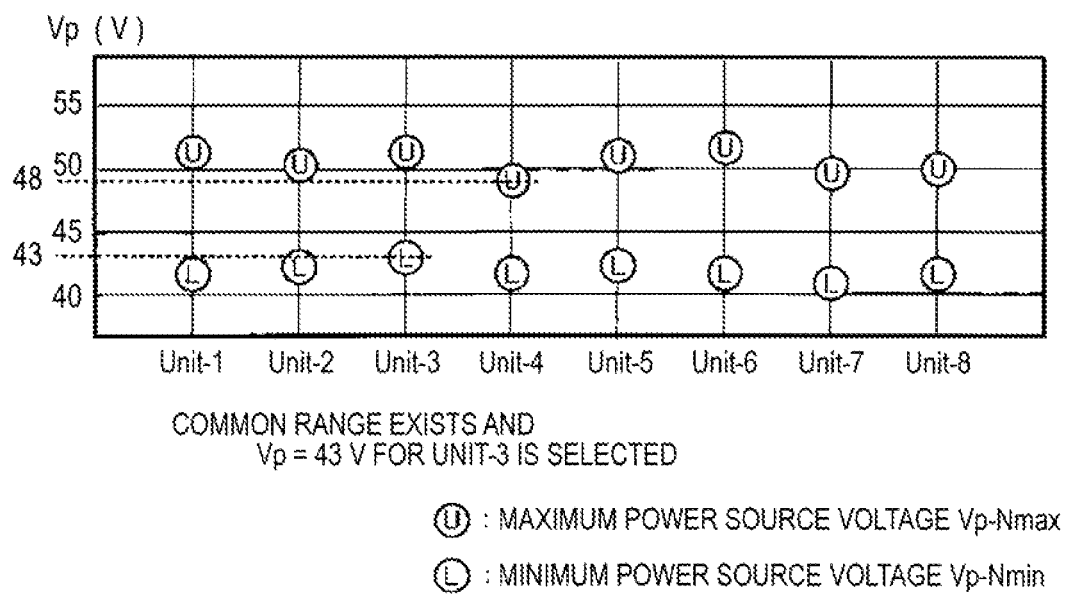
FIG. 12 shows distributions of minimum power source voltages and maximum power source voltages for respective units in Example 1 of the first exemplary embodiment.

FIG. 12 shows distributions of minimum power source voltages Vp-Nmin and maximum power source voltages Vp-Nmax for the respective units of a case the judgment result of step S194 shown in FIG. 11 is affirmative (Example 1). In FIG. 12, symbols L circled indicate minimum power source voltages Vp-Nmin and symbols U circled indicate maximum power source voltages Vp-Nmax.

As seen from FIG. 12, the maximum value of the minimum power source voltages Vp-Nmin is 43 V (for unit-3) and the minimum value of the maximum power source voltages Vp-Nmax is 48 V (for unit-4). The range that is delimited by these values 43 V and 48 V is a power source voltage range that is common to all of the units. Therefore, the minimum power source voltage Vp-Nmin (43 V) for unit-3 is determined as a power source voltage Vp for power saving or refraining thermal stress through heat generation of transistor.

The thus-determined power source voltage Vp does not become too low to obstruct a constant-current control operation in any of the units.

Next, examples of the power source voltage adjustment control which is performed at step S198 shown in FIG. 11 will be described (Examples 2-4). In each of Examples 2-4, since a power source voltage adjustment control is performed to finally obtain a power source voltage that is common to all of the units, an affirmative judgment result should be obtained at step S194 shown in FIG. 11.

EXAMPLE 2

Figure 13A:
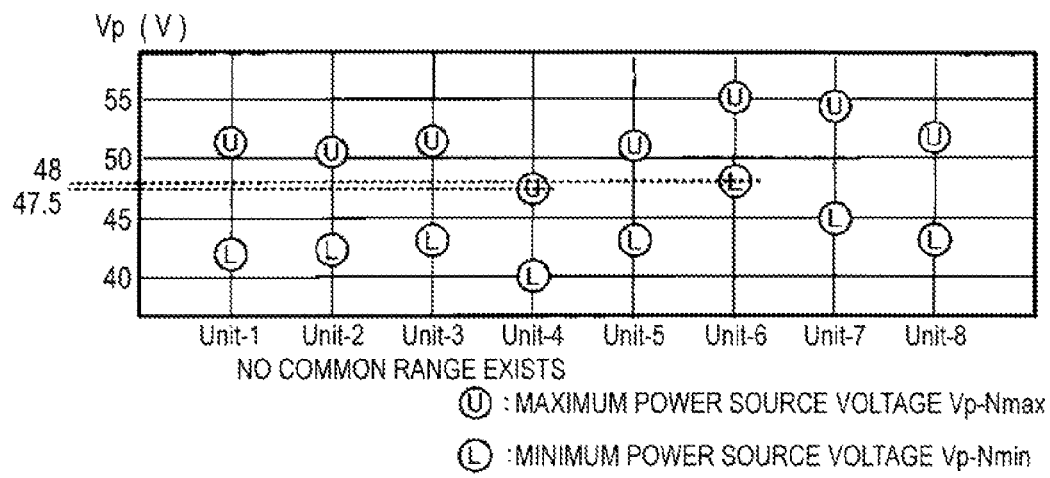
FIGS. 13A, 13B, 13C and 13D relate to Example 2 of the first exemplary embodiment.
Figure 13B:
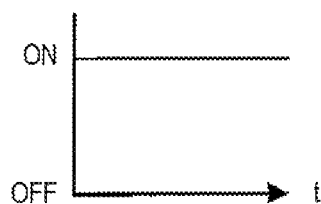
Figure 13C:
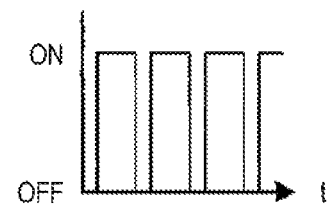
Figure 13D:
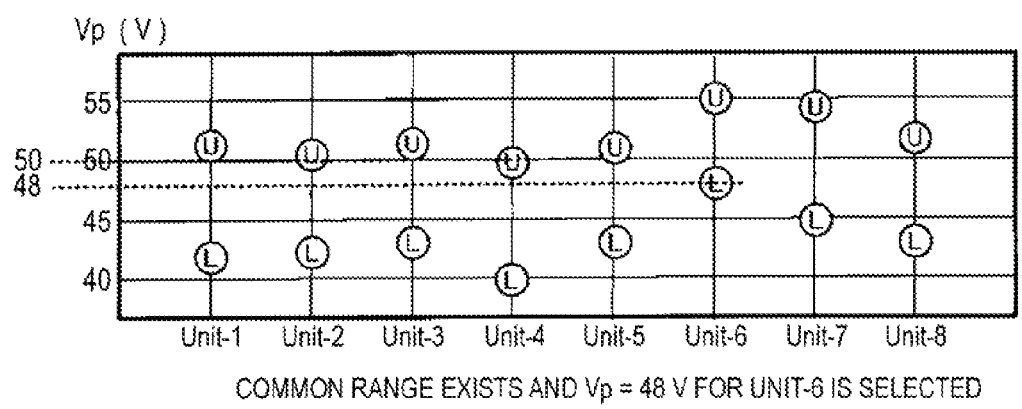

Example 2 will be described with reference to FIGS. 13A-13D. In FIGS. 13A and 13D, symbols L circled indicate minimum power source voltages Vp-Nmin and symbols U circled indicate maximum power source voltages Vp-Nmax.

As seen from FIG. 13A, the maximum value of the minimum power source voltages Vp-Nmin is 48 V (for unit-6) and the minimum value of the maximum power source voltages Vp-Nmax is 47.5 V (for unit-4). Since the maximum value of the minimum power source voltages Vp-Nmin is higher than the minimum value of the maximum power source voltages Vp-Nmax, there is no common power source voltage range.

In view of the above, in Example 2, the driving of the laser light emitting element 72 of unit-4 is PWM-controlled as described below. As shown in FIG. 13C, the drive control of the laser light emitting elements 72 is basically performed by continuous energization. As shown in FIG. 13C, the driving of the constant current source 114 of unit-4 is PWM-controlled (decimated driving by a duty ratio control). Whereas the instantaneous light emission intensity is increased, the light emission quantity is kept the same because of the temporal decimation.

Increase in light emission intensity means increase in drive current, which means increase in Vak, decrease in Vds, and increase in the voltage drop Vi at the resistor 124 through which the current flows. During light emission, while the Vds decrease absorbs the Vak increase, because of the increase of the current flowing through the resistor 124 the maximum power source voltage Vp-Nmax increases accordingly.

As a result, as shown in FIG. 13D, the minimum value of the maximum power source voltages Vp-Nmax becomes 50 V (for unit-4). As seen from FIG. 13D, the range that is delimited by the values 48 V and 50 V becomes a power source voltage range that is common to all of the units. The minimum power source voltage Vp-Nmin (48 V) for unit-6 is determined as a power source voltage Vp.

In Example 2, whereas the drive control of the laser light emitting elements 72 is basically performed so as to cause them to emit light continuously for a prescribed time, if necessary, the driving of the laser light emitting element 72 to give a range upper limit is PWM-controlled (temporal decimation) to obtain a necessary light emission quantity ((light emission quantity)=(light emission intensity)×time). The drive voltage Vak is thus increased.

Since drive voltage Vak is increased whereas the light emission quantity is kept the same, the maximum power source voltage Vp-Nmax, assuring a proper current control operation, for the laser light emitting element 72 concerned is raised, as a result of which a common power source voltage range is obtained while keeping the Electro Magnetic noise lower level caused by transistor switching by minimizing the number of PWM controlled units.

EXAMPLE 3

Figure 14A:
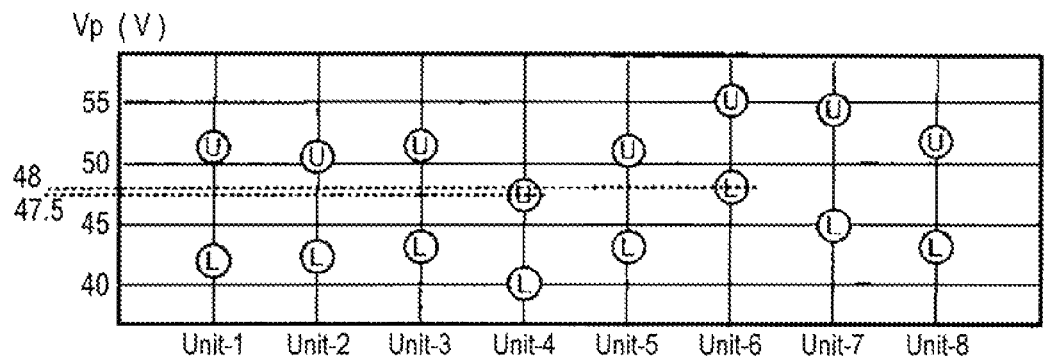
FIGS. 14A and 14B relate to Example 3 of the first exemplary embodiment.

Example 3 will be described with reference to FIGS. 14A and 14B. In FIGS. 14A and 14D, symbols L circled indicate minimum power source voltages Vp-Nmin and symbols U circled indicate maximum power source voltages Vp-Nmax.

As seen from FIG. 14A, the maximum value of the minimum power source voltages Vp-Nmin is 48 V (for unit-6) and the minimum value of the maximum power source voltages Vp-Nmax is 47.5 V (for unit-4). Since the maximum value of the minimum power source voltages Vp-Nmin is higher than the minimum value of the maximum power source voltages Vp-Nmax, there is no common power source voltage range.

In view of the above, in Example 3, the drive current I for the laser light emitting element 72 of unit-4 is increased within such a range as not to cause boiling of ink to be dried.

When the instruction drive current I of the transistor 122 is increased, its D-S voltage is lowered. Since the power source voltage Vp is the sum of the drive voltage Vak of the laser light emitting element 72 and the D-S voltage Vds of the transistor 122, the maximum power source voltage Vp-Nmax for unit-4 increases due to the decrease of the D-S voltage Vds.

Figure 14B:
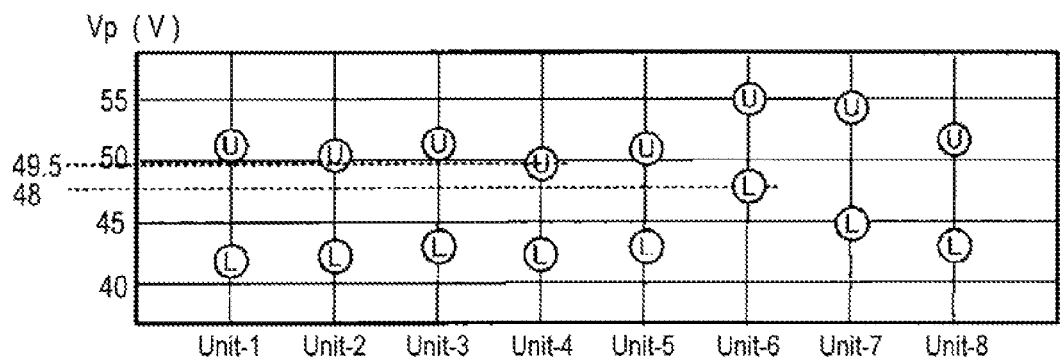

As a result, as shown in FIG. 14B, the minimum value of the maximum power source voltages Vp-Nmax becomes 49.5 V (for unit-4). As seen from FIG. 14B, the range that is delimited by the values 48 V and 49.5 V becomes a power source voltage range that is common to all of the units. The minimum power source voltage Vp-Nmin (48 V) for unit-6 is determined as a power source voltage Vp.

In Example 3, naturally, a resulting light emission quantity increase could cause an amount of heat that is wasteful in terms of energy saving. However, this does not affect the image quality because this setting is made on condition that boiling of ink to be dried will not occur.

In Example 3, whereas the laser light emitting elements 72 is basically driven so as to produce minimum necessary light emission quantities, if necessary, the laser light emitting elements 72 to give a range upper limit is driven so as to produce a larger light emission quantity than a necessary one. The drive voltage Vak is thus increased.

For example, where an operation that depends on light emission quantities (drying operation) has a certain limit light emission quantity (due to ink boiling), in Example 3 an excessive light emission quantity is employed that is smaller than the limit quantity, which is undesirable though in terms of energy saving. Since the drive voltage Vak is increased, the maximum power source voltage Vp-Nmax, assuring a proper current control operation, for the laser light emitting element 72 concerned is raised, as a result of which a common power source voltage range is obtained.

EXAMPLE 4

Figure 15A:
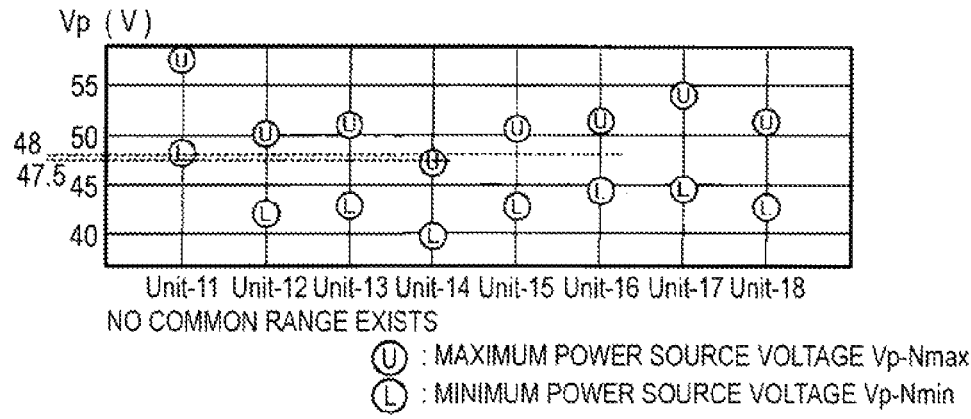
FIGS. 15A, 15B, 15C and 15D relate to Example 4 of the first exemplary embodiment.

Example 4 will be described with reference to FIGS. 15A-15D. In FIGS. 15A and 15D, symbols L circled indicate minimum power source voltages Vp-Nmin and symbols U circled indicate maximum power source voltages Vp-Nmax.

As seen from FIG. 15A, the maximum value of the minimum power source voltages Vp-Nmin is 48 V (for unit-11) and the minimum value of the maximum power source voltages Vp-Nmax is 47.5 V (for unit-14). Since the maximum value of the minimum power source voltages Vp-Nmin is higher than the minimum value of the maximum power source voltages Vp-Nmax, there is no common power source voltage range.

In view of the above, in Example 4, part of light emission quantities (amounts of heat) are taken on by another laser light emitting element group 74 that is deviated in the sheet P conveying direction.

Figure 15B:
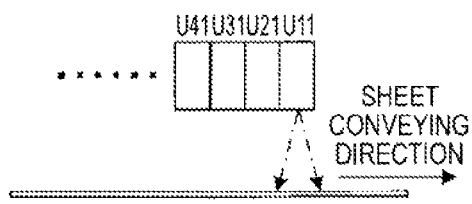

In Example 4, as shown in FIG. 15B, with attention paid to unit-11 of the first row, plural laser light emitting elements 72 (denoted by U21, U31, U41, . . . ) that belong to plural rows are disposed at the same position in the sheet P width direction as the laser light emitting element 72 (U11) of the first row and arranged in the sheet P conveying direction. Usually, the laser light emitting elements U11, U21, U31, . . . share a necessary total light emission quantity uniformly.

Figure 15C:
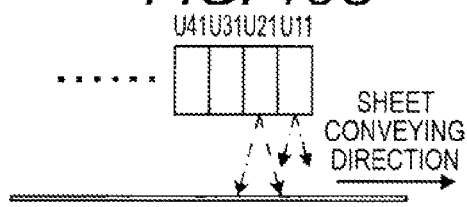
Figure 15D:
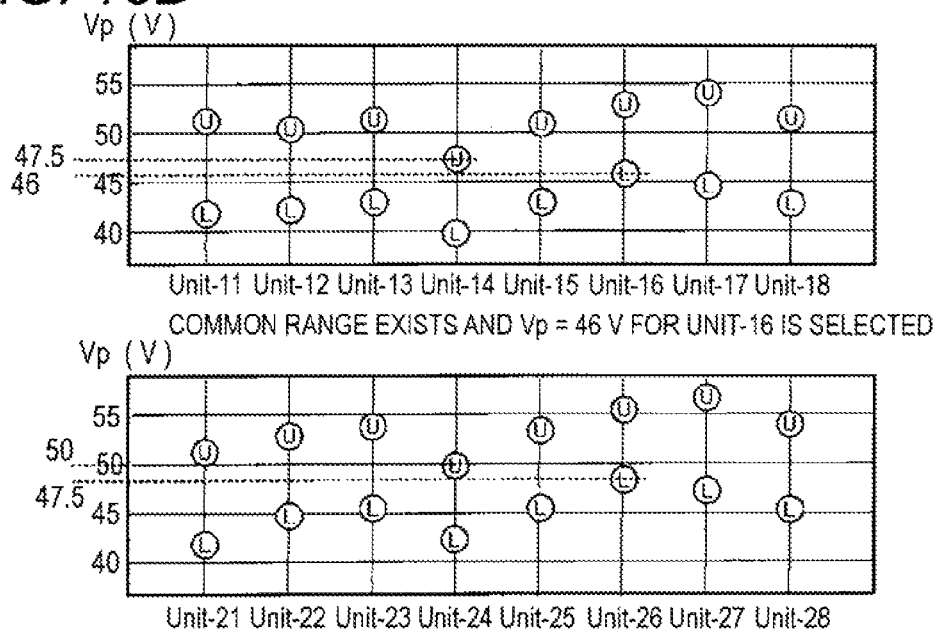

In Example 4, instead of employing the uniform sharing of a necessary total light emission quantity, the laser light emitting element U21 takes on part of a necessary light emission quantity of the laser light emitting element U11 (see FIG. 15C).

In this case, as shown in the top part of FIG. 15D, in the first row, the maximum value of the minimum power source voltages Vp-Nmin is changed to 46 V (for unit-16) and the minimum value of the maximum power source voltages Vp-Nmax remains 47.5 V (for unit-14). A common power source voltage range appears, and the minimum power source voltage Vp-Nmin (46 V) for unit-16 is determined as a power source voltage Vp.

On the other hand, as shown in the bottom part of FIG. 15D, in the second row, the maximum value of the minimum power source voltages Vp-Nmin is changed to 47.5 V (for unit-26) and the minimum value of the maximum power source voltages Vp-Nmax remains 50 V (for unit-24). A common power source voltage range also exists in the laser light emitting elements 72 of the second row, and the minimum power source voltage Vp-Nmin (47.5 V) for unit-26 is determined as a power source voltage Vp.

There is a control scheme in which whereas a light emission quantity that a laser light emitting element 72 to give a range upper limit needs to provide is usually produced by a single laser light emitting element 7, such a light emission quantity may be taken on through accumulation by plural cooperative laser light emitting elements 72 (e.g., ones arranged in the sheet P conveying direction) that are supplied with independent power source voltages and current-controlled so as to produce a specified light emission quantity together. In this case, the specified light emission quantity is shared uniformly by those laser light emitting elements 72. In Example 4, in the case where no common power source voltage range exists, a specified light emission quantity that a laser light emitting element 72 to give a range upper limit needs to provide is shared non-uniformly by cooperative laser light emitting elements 72 (arranged in the sheet P conveying direction).

Since drive voltage Vak of each laser light emitting element 72 is thereby decreased, the minimum power source voltage Vp-Nmin, assuring a proper current control operation, for the laser light emitting element 72 concerned is lowered, as a result of which a common power source voltage range is obtained.

It is noted that some or all of the concepts of Examples 2-4 may be combined with each other.

<Exemplary Embodiment 2>

A second exemplary embodiment will be described below. In the second exemplary embodiment, constituent elements having the same ones in the first exemplary embodiment will be given the same reference symbols as the latter and descriptions therefor will be omitted. The second exemplary embodiment is intended for compensation of response speed degradation due to a change of the power source voltage Vp that is made in the first exemplary embodiment.

In the second exemplary embodiment, instruction voltages Vi that are based on drive currents I for obtaining necessary light emission quantities corresponding to ink droplets ejection amounts are determined in advance. When the drive voltage Vk is changed from a low voltage to a high voltage in changing the instruction voltage Vi that is based on the drive current I, a control of raising the power source voltage Vp is performed in advance.

It takes a certain time for a drive voltage Vak (that is supplied from each power supply unit 112 to the associated laser light emitting elements 72 (see FIG. 5)) to reach a proper value (corresponding to an intended light emission quantity) depending on a speed of Power Supply Unit response to a light emission quantity variation (in particular, a light emission quantity increase). This may result in a problem that a necessary amount of heat cannot be secured for drying during an initial period of a light emission quantity variation (i.e., drying during a transition period).

In view of the above, drive voltage Vak corresponding to ink droplets ejection amounts are recognized in advance and a power source voltage Vp is changed earlier taking a Power Supply Unit delay time into consideration.

Figure 16:
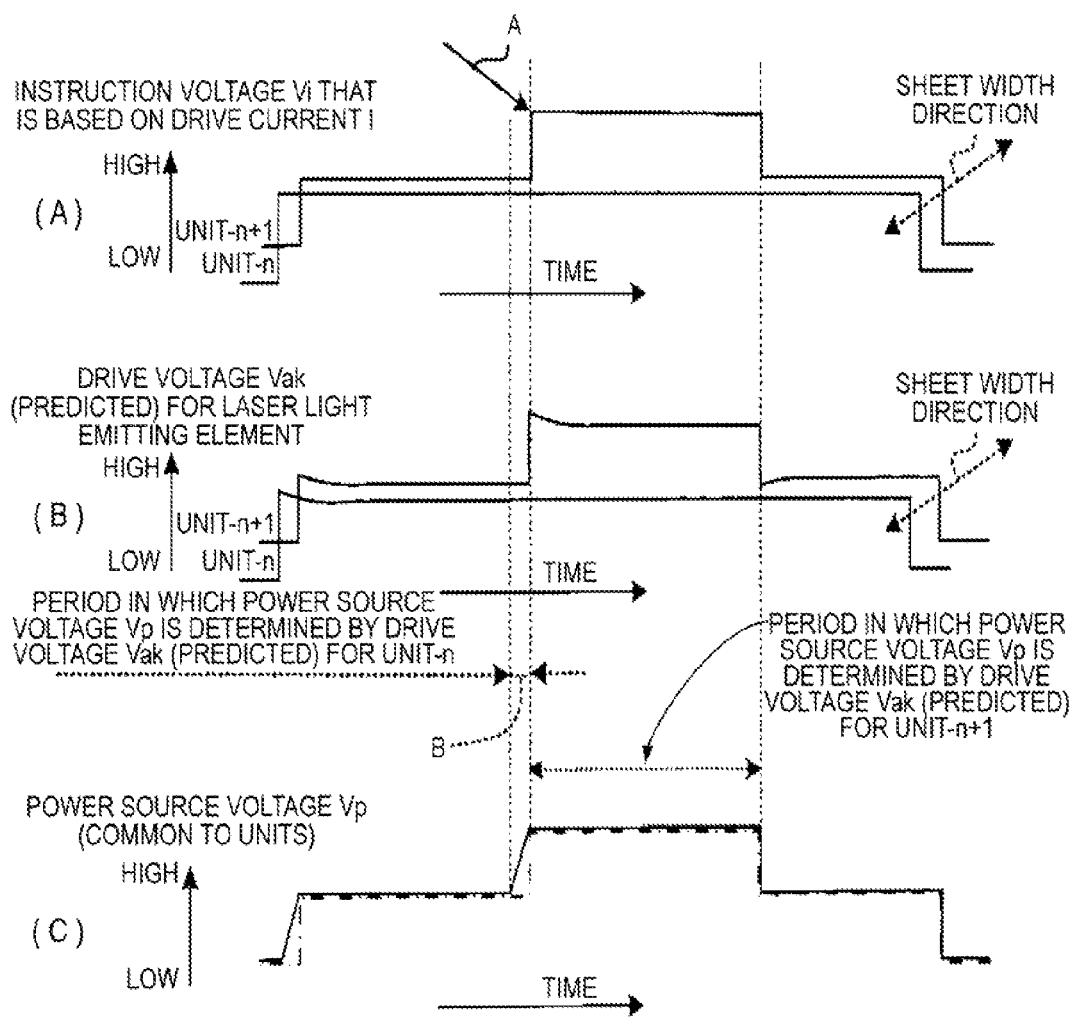
FIG. 16 relates to a second exemplary embodiment; part (A) is a timing chart showing temporal variations of instruction voltages Vi that are based on drive currents corresponding to light emission quantities, part (B) is a timing chart showing estimated drive voltages Vak for laser light emitting elements 72 corresponding to the light emission quantities, and part (C) is a timing chart showing a power source voltage Vp corresponding to the light emission quantities.

Part (A) of FIG. 16 shows example temporal variations of instruction voltages Vi of two laser light emitting elements 72 of unit-n and unit-n+1 arranged in the sheet P width direction. Although in part (A) of FIG. 16 the two waveforms of unit-n and unit-n+1 are deviated from each other in the time and voltage axis direction so as not to overlap with each other, actually the two instruction voltages Vi occur with the same timing.

It is seen from part (A) of FIG. 16 that a period (indicated by arrow A) exists when the instruction voltage Vi that is based on the drive current I for unit-n+1 becomes higher than the instruction voltage Vi that is based on the drive current I for unit-n. The drive voltage Vak for the laser light emitting element 72 of unit-n+1 needs to be increased in this period.

Part (B) of FIG. 16 shows waveforms of drive voltages Vak for the laser light emitting elements 72 predicted on the basis of the waveforms shown in part (A) of FIG. 16. Although in part (B) of FIG. 16 the two waveforms of unit-n and unit-n+1 are deviated from each other in the time axis direction so as not to overlap with each other, actually the two drive voltages Vak are applied with the same timing. In part (B) of FIG. 16, that the waveform portions of each drive voltage Vak are not flat is due to temperature variations of the laser light emitting element 72.

Part (C) of FIG. 16 shows a waveform of a power source voltage Vp, which is common to unit-n and unit-n+1. As shown in part (C) of FIG. 16, in the second exemplary embodiment, in a period B (see FIG. 16) in which the power source voltage Vp is usually determined by a drive voltage Vak for unit-n, the drive voltage Vp is increased gradually (linearly) from a time point determined taking the above-mentioned delay time into consideration so as to reach a target drive voltage Vp is obtained before the laser light emitting element 72 of unit-n+1 starts to be driven at an increased drive voltage Vak for unit-nil. In part (C) of FIG. 16, the chain-line waveform is a waveform of a power source voltage Vp of a case that the Power Supply Unit response speed compensation measure according to the second exemplary embodiment is not taken. On the other hand solid line show the case with the second exemplary embodiment is taken.

Although the second exemplary embodiment is directed to the case that the power source voltage Vp rises, it is preferable that likewise the power source voltage Vp be decreased gradually when the power source voltage Vp falls. The manner of gradual variation of the power source voltage Vp is not limited to a linear variation; the power source voltage Vp may be varied nonlinearly, for example, stepwise or according to a quadratic or ever higher-order function.

<Modification of Exemplary Embodiment 2>

In the second exemplary embodiment, as shown in part (C) of FIG. 16, the power source voltage Vp is increased gradually, whereby a sharp increase of the power consumption of the transistor 122 is prevented and the temperature of the transistor 122 is thereby prevented from becoming higher than the upper limit of its operation assurance temperature range.

Figure 17A:
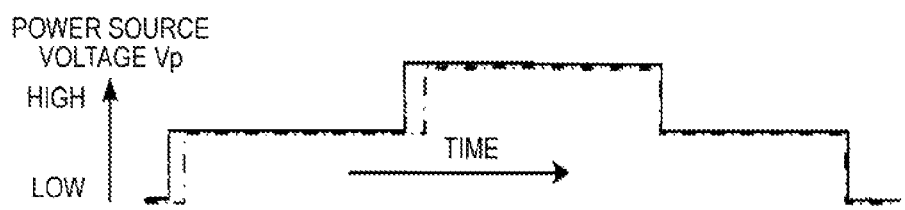
FIGS. 17A and 17B relate to Modification of the second exemplary embodiment.

For example, an alternative configuration is possible in which a threshold value is set for an increasing power source voltage Vp and, as shown in FIG. 17A, the power source voltage Vp is raised instantaneously at a time point determined taking the above-mentioned delay time into consideration if the threshold value is not exceeded.

According to Modification, a control for increasing the power source voltage Vp gradually is not necessary, whereby the control can be simplified. In FIG. 17A, the chain-line waveform is a waveform of a power source voltage Vp of a case that the response speed compensation measure according to Modification of the second exemplary embodiment is not taken.

Figure 17B:
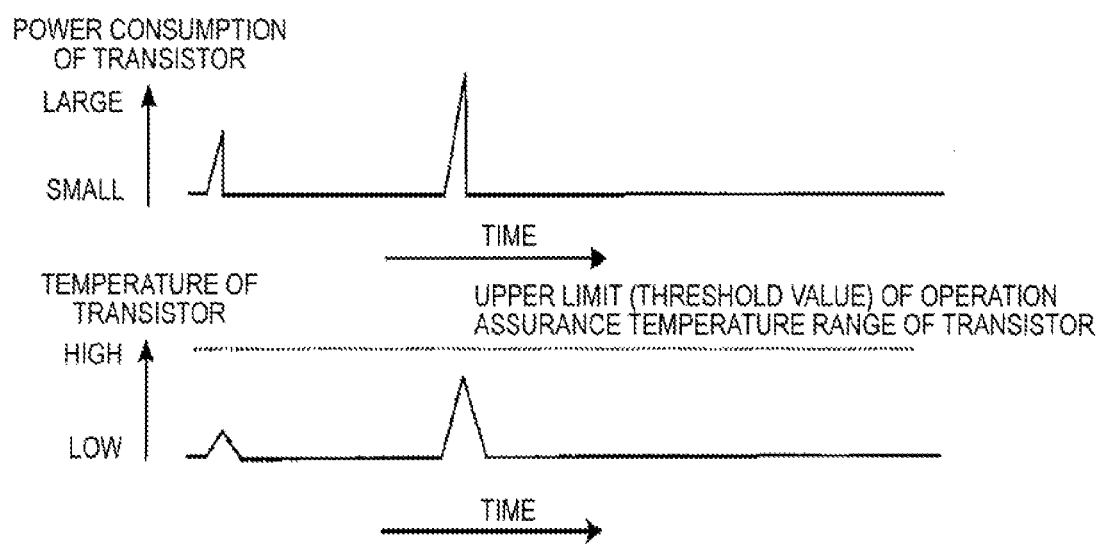

The top part and the bottom part of FIG. 17B show variations of the power consumption and the temperature of the transistor 122, respectively. A threshold value may be set according to these waveforms in the following manner.

The power consumption of the transistor 122 increases for relatively short times only when the power source voltage Vp is increased. Therefore, a power consumption of the transistor 122 within which increased temperatures do not exceed the upper limit of its operation assurance temperature range is set as a threshold value. Modification which is simple in control is applicable as long as the power consumption of the transistor 122 is lower than or equal to the threshold value.

Although in the laser drying devices 70 (70A and 70B) according to each of the first exemplary embodiment (including Examples 1-4) and the second exemplary embodiment (including Modification) the plural light emitting portions (dies) 76 of each laser light emitting element 72 are connected to each other in series, the light emitting portions (dies) 76 may be connected to each other in parallel or in series and parallel.

Although each of the first exemplary embodiment (including Examples 1-4) and the second exemplary embodiment (including Modification) is directed to the laser light emitting elements 72 that used in each drying device 70 of the inkjet recording apparatus 12, the application field of the invention is not limited to inkjet recording apparatus and encompasses drying devices in general for drying a layer formed by deposition of droplets by heat that is produced by irradiation with laser light emitted from laser light emitting elements.

Although in each exemplary embodiment the laser light emitting elements 72 are used as light emitting elements, the invention is applicable to cases in which other kinds of light emitting elements such as light-emitting diodes (LEDs) are used.

What is claimed is:

1. A light emitting elements drive control device comprising:
    a supplying unit that supplies a common power source voltage to a plurality of individual light emitting elements whose light emission quantities are controlled individually by current controls;
    a current control unit that performs current control by varying a drive voltage;
    a determining unit that determines voltage ranges capable of assuring proper current control operations on the individual light emitting elements based on drive voltages for each respective light emitting element that vary as the current controls are performed;
    a setting unit that sets the power source voltage to be supplied from the supplying unit from a common voltage range of the voltage ranges determined by the determining unit;
    a predicting unit that predicts drive voltages for the light-emitting elements in advance; and
    a changing unit that changes a power source voltage based on a drive voltage of a light emitting element predicted by the predicting unit so as to start changing the power source voltage earlier according to a response speed of the changing.

2. The light emitting elements drive control device according to claim 1, wherein the setting unit sets the power source voltage as a lower limit of the common voltage range.

3. The light emitting elements drive control device according to claim 2, wherein the changing unit changes the power source voltage linearly from a start to an end of the changing.

4. A droplets-deposited layer drying device comprising:
    the light emitting elements drive control device according to claim 2; and a drying unit that dries a layer, formed by deposition of droplets, with generated heat that depends on quantities of light emitted from the light emitting elements.

5. The light emitting elements drive control device according to claim 1, wherein the changing unit changes the power source voltage linearly from a start to an end of the changing.

6. A droplets-deposited layer drying device comprising:

the light emitting elements drive control device according to claim 1; and a drying unit that dries a layer, formed by deposition of droplets, with generated heat that depends on quantities of light emitted from the light emitting elements.

* * * * *